United States Patent
Andersson et al.

(10) Patent No.: US 7,876,448 B2
(45) Date of Patent: Jan. 25, 2011

(54) FIBER-OPTIC CURRENT SENSOR WITH SUM DETECTION

(75) Inventors: Lars Andersson, Kirchdorf (CH); Hubert Braendle, Oberengstringen (CH); Klaus Bohnert, Oberrohrdorf (CH)

(73) Assignee: ABB Research Ltd. (CH)

(*) Notice: Subject to any disclaimer, the term of this patent is extended or adjusted under 35 U.S.C. 154(b) by 103 days.

(21) Appl. No.: 12/245,073

(22) Filed: Oct. 3, 2008

(65) Prior Publication Data

US 2009/0097796 A1    Apr. 16, 2009

Related U.S. Application Data

(63) Continuation of application No. PCT/CH2006/000194, filed on Apr. 4, 2006.

(51) Int. Cl.
*G01B 9/02* (2006.01)

(52) U.S. Cl. ..................................................... 356/483

(58) Field of Classification Search ......... 356/364–370, 356/450–521
See application file for complete search history.

(56) References Cited

U.S. PATENT DOCUMENTS

| | | | |
|---|---|---|---|
| 4,370,612 A | 1/1983 | Puech et al. | |
| 4,814,930 A | 3/1989 | Abe et al. | |
| 5,124,634 A | 6/1992 | Ulmer, Jr. et al. | |
| 5,295,207 A | 3/1994 | Dupraz et al. | |
| 5,365,175 A | 11/1994 | Patterson et al. | |
| 5,644,397 A * | 7/1997 | Blake | 356/483 |
| 6,703,821 B2 * | 3/2004 | Dyott | 324/96 |
| 2004/0160608 A1 * | 8/2004 | Bohnert et al. | 356/483 |

FOREIGN PATENT DOCUMENTS

| | | |
|---|---|---|
| EP | 0409589 B1 | 1/1991 |
| EP | 0856737 A1 | 8/1998 |
| EP | 1174719 A1 | 1/2002 |
| EP | 1512981 A1 | 3/2005 |
| JP | 60253880 A | 12/1985 |
| JP | 63050761 A | 3/1988 |
| JP | 5172854 A | 7/1993 |
| WO | 9719361 A1 | 5/1997 |
| WO | 0062082 A2 | 10/2000 |

OTHER PUBLICATIONS

International Search Report and Written Opinion of the International Searching Authority, Mar. 1, 2007 (14 pages).

* cited by examiner

*Primary Examiner*—Tarifur Chowdhury
*Assistant Examiner*—Jonathon D Cook
(74) *Attorney, Agent, or Firm*—St. Onge Steward Johnston & Reens LLC

(57) ABSTRACT

To measure a sum of electrical currents in different conductors, light is led in an optical sensing fiber around all the conductors. The sensing fiber can be wound around the conductors in a single loop or in several individual loops. Interspersed polarization maintaining fibers and retarders can be used to transfer the light between individual loops for preventing undesired signals from stray magnetic fields. The method has high accuracy is particularly suited for measuring large currents that sum up to zero.

17 Claims, 2 Drawing Sheets

FIBER-OPTIC CURRENT SENSOR WITH SUM DETECTION

CROSS-REFERENCE TO RELATED APPLICATIONS

The present application is a continuation of pending International patent application PCT/CH2006/000194 filed on Apr. 4, 2006 which designates the United States and the content of which is incorporated herein by reference.

FIELD OF THE INVENTION

The invention relates to the field of measurement of electrical currents using the propagation of light waves in an optical fiber under influence of the Faraday effect.

BACKGROUND OF THE INVENTION

The optical measurement of electrical currents using the Faraday effect has significant advantages, such as a high linearity of the response even for large currents, which is of importance for measurements under short-circuit conditions.

In order to measure the sum of two or more current with an optical sensor (such as described e.g. in EP 1 174 719), independent sensors each with its own control electronics can be used. The control electronics convert the physical measurements from the sensor to a digitized number. The numbers are then added to obtain the sum of the currents.

SUMMARY OF THE INVENTION

It is an object of the present invention to provide an improved method that allows the measurement of a sum of currents in different conductors. This object is achieved by the method of claim 1.

Accordingly, light is led in at least one optical fiber around all the conductors. This is based on the understanding that the total phase shift between the two circularly polarized modes in the sensing fiber will depend on the sum of the currents in the conductors that are surrounded by the sensing fiber.

Hence, the present method obviates the need for individual optical systems and control electronics at each fiber, nor does it require any balancing of the systems at the individual fibers. The summing is inherently carried out by the additive (or subtractive) contribution of each current to the magnetic field and thus to the phase shift between the two optical waves propagating along the sensing fiber.

The term "a sum of currents" is to be construed to include situations where direction of the current in at least one conductor in respect to the winding direction in that conductor differs from the direction of the current in another conductor in respect to the winding direction in that other conductor. In such situations, the signs of the currents are opposite, i.e. the sum of the currents corresponds to the difference of the absolute values of the currents. This condition may e.g. arise if the fibers are wound in the same sense around all conductors but the current in one conductor runs in opposite direction to the current in the other conductors. This condition may also arise when all currents flow in the same direction but the fiber is wound clockwise around some of them and anti-clockwise around others.

The present method is particularly useful for monitoring if a set of currents adds up to a zero sum current. Conventional methods based on separate measurement systems have, in this case, the disadvantage that even small errors in the measurement of the individual currents can add up to substantial errors in the sum if the sum is close to 0.

The summed currents can differ in value, amplitude and/or phase.

The method can also be used for measuring a weighted sum of currents by using different numbers of sensing fiber windings around individual conductors.

A particularly useful application of the invention is the monitoring of input and output currents of transformers. The input current and the output current of such transformers should, in the absence of leak currents, have a ratio equal to the coupling ratio of the transformer. Hence, leading the light around conductors carrying the input and output currents allows to monitor the transformer if the ratio of the numbers of loops of the sensing fiber around the input and output conductors corresponds to the coupling ratio of the transformer.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

The fiber optic sensor considered in the present invention may be any type of fiber-optic sensor exploiting the Faraday effect, such as the one described in EP 1 174 719. It uses a fiber coil operated in reflection. The electronics module sends two orthogonal linearly polarized light waves via a polarization maintaining fiber (PMF, for example an elliptical-core fiber) to the sensing fiber, which encloses the current conductor. A retarder at the entrance end of the sensing fiber converts the linear waves into left and right circularly polarized light waves. The circularly polarized light waves in the sensing fiber are subject to a differential phase shift proportional to the current due to the Faraday effect.

The present invention can, however, also be used with Sagnac type current sensors as disclosed in EP 856 737.

The sensing fiber is advantageously prepared as described in EP 856 737 (a thermally annealed fiber, in case of small coil diameters of less than 200-500 mm) or packaged as described in EP 1 512 981 (in case of relatively large coil diameters and when flexible coils are desired).

Figure 1:
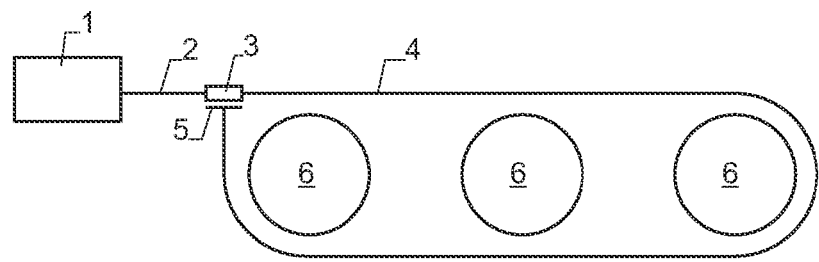
FIG. 1 shows a first embodiment of the invention.

FIG. 1 shows a first embodiment for measuring the sum of currents in separate conductors (in the present embodiment of three currents in three conductors).

A sensor control unit 1 couples two linearly polarized light waves into a polarization maintaining fiber 2, at the end of which they pass a $\lambda/4$-retarder 3 aligned under 45° to the main axes of the fiber. In retarder 3, the two linear modes of fiber 2 are converted to right and left circularly polarized light waves, which propagate along a sensing fiber 4, are reflected by a mirror 5 at the end of the same, and travel back to retarder 3 where they are converted back to two linearly polarized light waves that return to the sensor control unit 2. Sensor control unit 1 is equipped to measure the phase delay introduced between the two circular light waves that were traveling along sensing fiber 4.

In the embodiment of FIG. 1, sensing fiber 4 encloses three conductors 6 in a single loop. Sensing fiber 4, however, may form any integer number N of loops. The beginning of sensing fiber 4 (at retarder 3) and its end (at mirror 5) must coincide in space so that a closed loop results and the magnetic field is integrated along a closed path. The sensor in then insensitive to stray magnetic fields from conductors outside the loop and the signal is independent of the positions of the conductors within the same.

The magnetically induced phase shift between the two circularly polarized waves within sensing fiber 4 depends on the sum of the currents through the three conductors 6. As mentioned above, this sum is sensitive to the signs of the currents, i.e. the directions of the currents. For example, if the sum of the absolute values of three direct currents is to be measured, all currents must flow through the fiber loop in the same direction. If one current flows in the opposite direction, it will contribute with opposite sign to the total signal, i.e. it will be subtracted from the sum of the other two currents.

Figure 2:
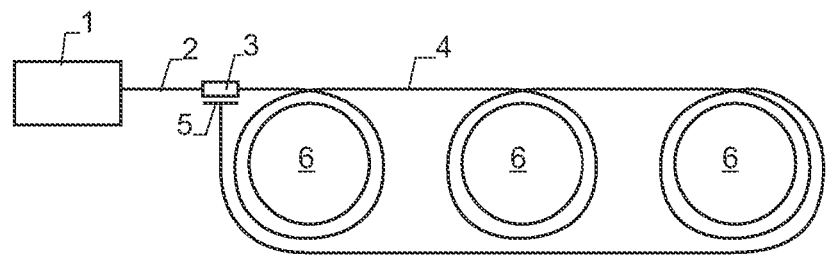
FIG. 2 shows a second embodiment of the invention.

In the second embodiment of FIG. 2, each conductor 6 is enclosed by one individual fiber loop and all conductors 6 are enclosed by a further common fiber loop. The effective number of loops around each conductor 6 is thus 2. It is important that the fiber encloses all conductors 6 with the correct sense (clockwise or counter-clockwise) so that all currents are detected with the correct sign.

The number of fiber loops may differ for different conductors in order to calculate a weighted sum of the different currents, where the weight of each sum corresponds to the number of fiber loops around it.

In some applications, for example in gas-insulated switchgear (GIS) for high-voltage substations, the required diameter of the fiber loops and the distance between them can be relatively large. This will result in a comparatively long sensing fiber if the techniques of FIG. 1 or 2 are to be used. With increasing fiber length, stress from the bends and packaging as well as fiber anisotropies can increasingly alter the polarization states of the circular light waves and thus reduce the accuracy of the sensor.

Figure 3:
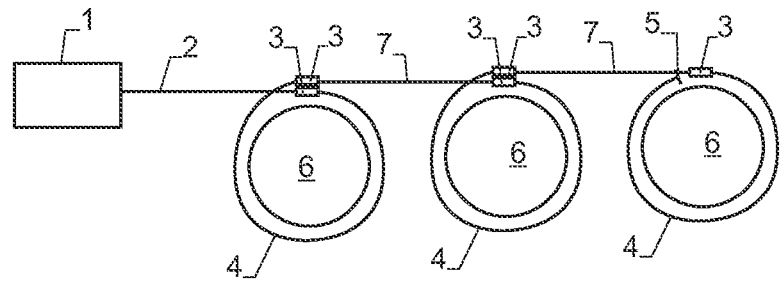
FIG. 3 shows a third embodiment of the invention.

This drawback is avoided by the embodiment of FIG. 3, which reduces the total length of the sensing fiber. In this embodiment, each conductor 6 has its own, individual section of sensing fiber 4. The different of sensing fiber 4 are connected by polarization maintaining fibers 7. These fibers 7 are of the same type as fiber 2 and serve to transmit the linear polarized light from conductor to conductor. Further quarter-wave retarders 3 are arranged at the end of the first sensing fiber section, at the beginning and end of the second sensing fiber section, and at the beginning of the last sensing fiber section. The birefringent axes of the retarders 3 are oriented at 45° with respect to the adjacent PMFs 7. The retarders 3 carry out a conversion of the circularly polarized waves in the sections of sensing fiber 4 to two linearly polarized waves traveling along the following PMFs 7, and vice versa.

The last sensing fiber section is terminated by a mirror 5 for sending back the light along the PMFs 7 and sensing fibers 4 to sensor control unit 1.

The sign of the 45° angle between each retarder 3 and its adjacent PMF 2 or 7 must be chosen properly so that each sensing fiber coil contributes with the correct sign to the total signal. A light wave that is, for example, left circular in the first sensing fiber section must again be left circular in the other sections if the currents are to be added. This requires that both retarders of a given sensing fiber section 4 are either at +45° or −45° with respect to the fast axis of the corresponding pm fiber (angle as seen when looking from the polarization maintaining fiber towards the retarder).

If the retarder orientation is chosen such that a left circular light wave in the first sensing fiber section becomes right circular in the second sensing fiber section, the second sensing fiber section must be wrapped around the conductor in opposite sense to the first sensing fiber section in order to have both currents contribute to the signal with the same sign.

Figure 4:
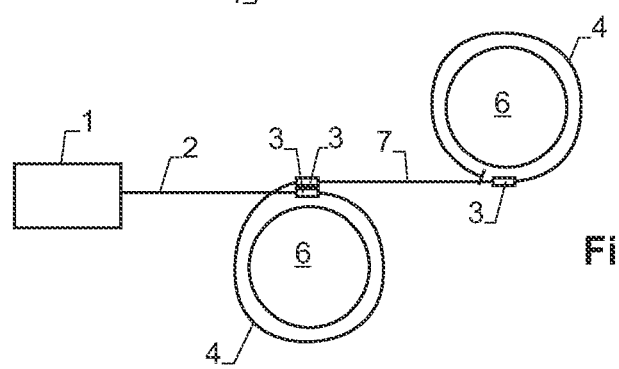
FIG. 4 shows a fourth embodiment of the invention.

For measuring the difference of two currents, the arrangement of FIG. 4 can be used. This embodiment uses the technique of the third embodiment with a polarization maintaining fiber 4 between two sections of sensing fiber 4 and quarter-wave retarders 3 for converting between the linear polarizations in the PMFs 2 and 7 and the circular polarizations in the sections of sensing fiber 4.

In the embodiment of FIG. 4, the two sections of sensing fiber 4 are wound in different sense around the conductors 6, the first section of sensing fiber 4 forming a clockwise loop while the second section of sensing fiber 4 forming a counter-clockwise group. This insures that the two currents contribute with opposite sign to the signal.

Alternatively, both loops can be wound in the same sense around the conductors 6, in which case the retarders 3 must be arranged to transform light that is left circular in the first sensing fiber section into light that is right circular in the second sensing fiber section, and vice versa.

Figure 5:
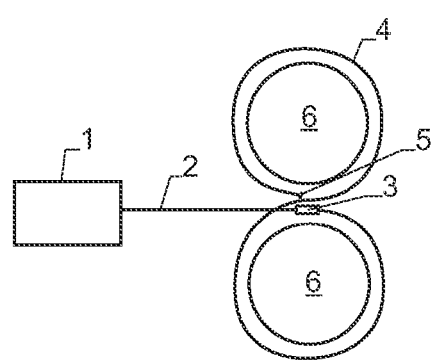
FIG. 5 shows a fifth embodiment of the invention.

An alternative embodiment for measuring a difference between two currents is shown in FIG. 5. Here a single section of sensing fiber 4 is used, which encloses the two conductors 6 in the form of a FIG. 8 loop. The retarder 3 and reflector 5 are positioned at the central crossing point of the sensing fiber section. The forward propagating light travels clockwise around the lower conductor but counterclockwise around the upper conductor. As a result, the sensor signal corresponds to the difference of the two currents.

Figure 6:
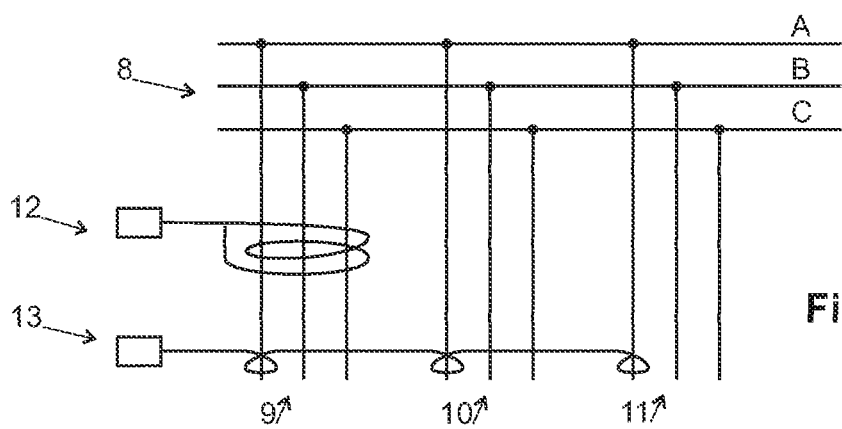
FIG. 6 shows two applications of the invention for monitoring current sums.

FIG. 6 illustrates two applications of the present technology. It shows a three-phase bus bar 8 having three input/output branches 9, 10, 11.

A first sensor 12 according to the current invention monitors the sum of the currents of the three phases of input/output branch 9. It is of the type shown in FIG. 1 with a single section of sensing fiber 4, but the sensing fiber 4 is wound several times around the three conductors of input/output branch 9 to increase the signal. (Note that the retarders and mirrors are not shown in FIG. 6.) Sensor 12 is used to monitor if the sum of the currents in the three phases A, B and C of said branch 9 is 0. A non-zero sum is indicative of a problem in the system.

A second sensor 13 is e.g. of the type shown in FIG. 3 has a loop of sensing fiber wound around the phase A of each input/output branch 9, 10, 11. It monitors that the sum of the currents of phase A at all branches is 0. A non-zero sum is indicative of a problem in bus bar 8. Similar sensors can also be used to monitor the sum of currents in phase B or C.

Figure 7:
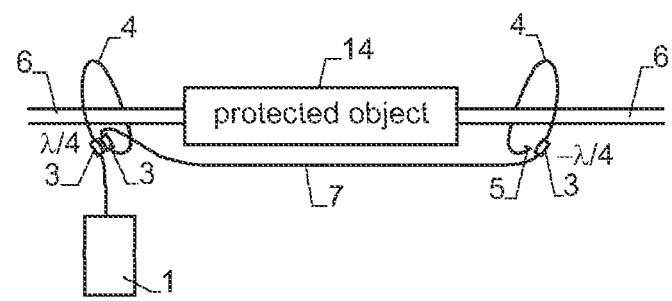
FIG. 7 shows an application for monitoring a protected object.

A further application is shown in FIG. 7. Here, the sensor monitors the current flow through a protected object 14 connected to two conductors 6. It is assumed that, under normal operation, protected object 14 is operating such that the current flowing in through one conductor 6 must exit through the other conductor 6.

Here, the sensor 14 is arranged to measure the difference between the currents going in and coming out of protected object 14 in order to monitor that no fault/leak current is present.

In the embodiment of FIG. 7, the loops around the two conductors 6 have the same winding sense, but the retarders 3 at the first conductor 6 introduce a phase shift of $\lambda/4$, while the one at the second conductor introduces a phase shift of $-\lambda/4$, thereby causing the contributions from the two currents to be subtracted in the summed signal.

Figure 8:
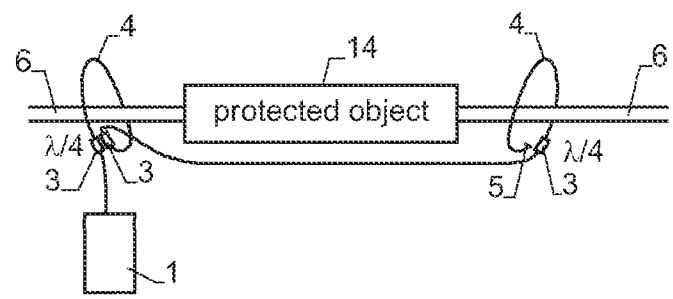
FIG. 8 shows a first alternative to FIG. 7.

FIG. 8 shows an embodiment serving the same purpose, but here the two loops have different winding direction, while the retarders 3 all induce the same phase shift.

Figure 9:
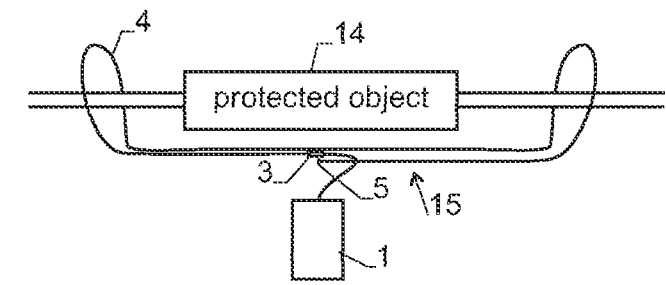
FIG. 9 shows a second alternative to FIG. 7.

Yet another embodiment for subtracting the two currents is shown in FIG. 9. It basically corresponds to the embodiment of FIG. 5 with a single section of sensing fiber 4. It forms two loops wound in opposite directions around the two conductors 6, the loops being connected via a central section 15 of sensing fiber 4. In central section 15, the two strands of sensing fiber are located in close vicinity, thereby minimizing errors in the measured signal.

Figure 10:
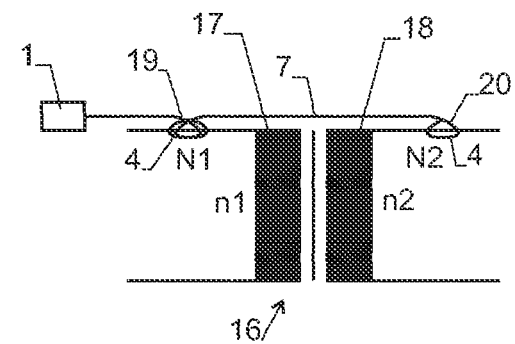
FIG. 10 shows an application of the invention for monitoring a transformer.

A further application is shown in FIG. 10. Here the sensor is used for monitoring a transformer 16 having a first electrical coil 17 with n1 windings and a second coil 18 with n2 windings. A first coil 19 of N1 windings of sensing fiber 4 is wound around a conductor of first electrical coil 17, while a second coil 20 of N2 windings of sensing fiber is wound around a conductor of second electrical coil 18. A polarization maintaining fiber 7 extends between the two coils 19, 20, and retarders are used (not shown) for transformation of the circular polarizations in the sensing fibers 4 and the linear polarizations in the PMF 7.

If transformer 16 operates correctly, the ratio of the currents in the first and the second electrical coils 17 and 18 is equal to the transformer's coupling ratio n2:n1. When choosing n2:n1=N2:N1, i.e. if the ratio N2:N1 is equal to a coupling ratio of the transformer, the signal measured by the sensor is zero under ideal operation of the transformer. In the presence of leak currents, the signal deviates from 0. Hence, the signal from the sensor allows an early and accurate detection of leaks in transformer 16.

The present invention is also well suited to measure systems where the currents in at least two of the conductors are different. The currents can be ac- or dc-currents. In the case of ac-currents, the currents may e.g. differ by amplitude and/or phase.

What is claimed is:

1. A method for measuring a sum or a difference of currents in a plurality of conductors using the Faraday effect in optical fibers, comprising the steps of:
    positioning an optical sensing fiber around at least two of the plurality of conductors,
    positioning retarders in the optical sensing fiber between said at least two conductors,
    leading two circularly polarized light waves in said optical sensing fiber around each of said at least two conductors,
    converting the circularly polarized light waves to linearly polarized light waves with the retarders, and
    transmitting said linearly polarized light waves from conductor to conductor in at least one polarization maintaining fiber,
    detecting the change in polarization, and
    determining a sum or a difference of the currents.

2. The method of claim 1, further comprising the steps of providing each conductor with its own individual section of sensing fiber, and connecting the different sensing fibers by the at least one polarization maintaining fiber.

3. The method of claim 1, further comprising the steps of transmitting two orthogonal linearly polarized light waves with an electronics module via a polarization maintaining lead fiber to at least one of the sensing fibers, and wherein the polarization maintaining fibers are the same type of fiber as the polarization maintaining lead fiber.

4. The method of claim 1, further comprising the steps of orienting birefringent axes of the retarders at 45° with respect to adjacent polarization maintaining fibers, and the sign of the 45° angle between each retarder and its adjacent polarization maintaining fiber is selected such that each sensing fiber coil contributes to the total signal.

5. The method of claim 1, wherein currents of at least two of said conductors are different.

6. The method of claim 1, further comprising the steps of leading the light in a first direction around a first of said at least two conductors and leading the light in a second direction, opposite to said first direction, around a second of said at least two conductors in order to measure a difference of the currents in said conductors.

7. The method of claim 1, further comprising the steps of
    leading the light in the same direction around both said two conductors,
    converting but light that is left circular when led around the first conductor to right circular light for being led around the second conductor, and
    converting light that is right circular when led around the second conductor to left circular for being led around the first conductor.

8. The method of claim 1, further comprising the steps of leading said light in N1 windings around a first of said at least two conductors and leading said light a in N2 windings around a second of said at least two conductors, wherein N1≠N2 for measuring a weighted sum of the currents in said conductors.

9. The method of claim 1, wherein said at least two conductors comprise a first and a second conductor, said method further comprising the steps of:
    carrying a first current in the first conductor through a first electrical coil with $n_1$ windings of a transformer,
    carrying a second current in the second conductor through a second electrical coil with $n_2$ windings of the transformer,
    wherein the light is led in a first coil of N1 windings of sensing fiber around the first conductor and in a second coil of N2 windings of sensing fiber around the second conductor, and
    extending a polarization maintaining fiber between the two coils of sensing fiber, and
    transforming circular polarizations in the sensing fibers and linear polarizations in the polarization maintaining fibers,
    wherein a ratio of the currents in the first and the second electrical coils and is equal to the transformer's coupling ratio $n_2:n_1$, and a ratio N2:N1 of windings of sensing fibers is equal to the coupling ratio of the transformer.

10. The method of claim 1, wherein current flowing in through one of said at least two conductors exits through the other one of said at least two conductors and a sensor measures the difference between the currents going in and coming out of a protected object in order to monitor that no fault/leak current is present.

11. The method of claim 1, wherein loops around the at least two conductors have the same winding sense, and a retarder at one of said at least two conductors introduces a phase shift of $\lambda/4$, and a retarder at the other one of said at least two conductors introduces a phase shift of $-\lambda/4$, thereby causing the contributions from the two currents to be subtracted in the summed signal, or the loops around the two conductors have an opposite winding direction, and retarders at the at least two conductors induce the same phase shift thereby causing the contributions from the two currents to be subtracted in the summed signal.

12. The method of claim 1, wherein the fiber coil is operated in reflection, or a Sagnac type current sensor is used.

13. The method of claim 1, wherein a three-phase bus bar has three input/output branches, a first sensor has a single section of sensing fiber wound around three conductors of the first input/output branch and monitors if the sum of currents in three phases A, B, and C of said three branches is zero, and a second sensor has a loop of sensing fiber wound around the phase A of each input/output branch and monitors if the sum of the currents of phase A at all branches is zero.

14. The method of claim 1, wherein said method is used for monitoring if a set of currents adds up to a zero sum current.

15. The method of claim 1, wherein said method is used for monitoring a transformer.

16. A method for measuring a sum or a difference of currents in a plurality of conductors using the Faraday effect in optical fibers comprising the steps of:
  propagating circularly polarized light waves individually around at least two of the conductors;
  converting the circularly polarized light waves to linearly polarized light waves with retarders positioned between the at least two conductors; and
  transmitting the linearly polarized light waves from conductor to conductor in at least one polarization maintaining fiber;
  detecting the change in polarization; and
  determining a sum or a difference of the currents.

17. A method for measuring a difference between two currents in two conductors using the Faraday effect in optical fibers comprising the steps of:
  enclosing the two conductors with a single section of sensing fiber;
  positioning a first and a second retarder at a first one of the two conductors;
  positioning a third retarder and a reflector at a second one of said two conductors;
  propagating circularly polarized light waves around the first conductor;
  converting circularly polarized light waves to linearly polarized light waves;
  transmitting the linearly polarized light waves from the first conductor to the second conductor in a polarization maintaining fiber;
  converting the linearly polarized light waves to circularly polarized light waves;
  propagating the circularly polarized light waves around the second conductor; and
  determining a difference of the currents.

* * * * *